United States Patent
Jeong et al.

(10) Patent No.: US 7,051,428 B2
(45) Date of Patent: May 30, 2006

(54) IN LINE SYSTEM USED IN A SEMICONDUCTOR PACKAGE ASSEMBLING

(75) Inventors: Ki-Kwon Jeong, Chungcheongnam-do (KR); Dong-Kuk Kim, Kyungki-Do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 258 days.

(21) Appl. No.: 10/607,600

(22) Filed: Jun. 27, 2003

(65) Prior Publication Data

US 2004/0009650 A1 Jan. 15, 2004

(30) Foreign Application Priority Data

Jul. 12, 2002 (KR) .................. 10-2002-0040846

(51) Int. Cl.
- B23P 15/26 (2006.01)
- H05K 13/04 (2006.01)
- H01L 21/301 (2006.01)
- H01L 21/46 (2006.01)
- H01L 21/78 (2006.01)

(52) U.S. Cl. .................. 29/729; 29/25.01; 29/742; 29/759; 29/827; 438/462

(58) Field of Classification Search .............. 29/729, 29/742, 759, 25.01, 827; 451/69, 48; 156/285, 156/282, 297; 438/462, 464, 458

See application file for complete search history.

(56) References Cited

U.S. PATENT DOCUMENTS

| 5,068,567 | A | * | 11/1991 | Jones | 310/332 |
| 5,961,768 | A | * | 10/1999 | Tsujimoto | 156/285 |
| 5,981,391 | A | * | 11/1999 | Yamada | 438/690 |
| 6,048,749 | A | * | 4/2000 | Yamada | 438/64 |
| 6,153,536 | A | * | 11/2000 | Brouillette et al. | 438/758 |

* cited by examiner

Primary Examiner—A. Dexter Tugbang
Assistant Examiner—Tai Van Nguyen
(74) Attorney, Agent, or Firm—Marger Johnson & McCollom, P.C.

(57) ABSTRACT

A dicing tape attaching unit that can attach both a pre-cut dicing tape and a general dicing tape to a wafer in a semiconductor package assembling process, and an in-line system used in a semiconductor package process including the dicing tape attaching unit are provided. The dicing tape attaching unit supplies one of the pre-cut dicing tape and the general dicing tape and attaches it to a wafer according to the direction of rotation of a tape loader. Accordingly, without an additional pre-cut dicing tape attaching unit, either of the pre-cut dicing tape and the general dicing tape can be attached to the back side of the wafer by one and the same unit.

8 Claims, 10 Drawing Sheets

IN LINE SYSTEM USED IN A SEMICONDUCTOR PACKAGE ASSEMBLING

BACKGROUND OF THE INVENTION

This application claims the priority of Korean Patent Application No. 2002-40846, filed on Jul. 12, 2002, in the Korean Intellectual Property Office, the disclosure of which is incorporated herein in its entirety by reference.

1. Field of the Invention

The present invention relates to the field of a semiconductor package assembly, and more particularly, to a dicing tape attaching unit, and to an in-line system including the dicing tape attaching unit.

2. Description of the Related Art

Numerous semiconductor chips can be formed from a semiconductor wafer manufactured in a wafer manufacturing process. When a wafer is diced, the semiconductor chips are created. However, these individual semiconductor chips are incomplete and not able to function unless they have external connection terminals, such as solder balls or leads. These external connection terminals can be easily damaged by shock or impact. A semiconductor package assembling process is employed to seal a semiconductor chip to protect it from external shock and impact, and to permit an effective external connection terminal to be formed.

In the general order in which a semiconductor package is assembled, a wafer is attached to a dicing tape using a ring frame. Then, a dicing process is performed in which individual chips are separated from the wafer using a dicing blade formed of diamond. Subsequently, the individual chips are adhered onto a lead frame or substrate, and a wire bonding process is then performed.

In order to reduce the size of semiconductor packages, a process of grinding down the back-side of a wafer to reduce its thickness is often performed before attaching the wafer to a dicing tape. Such a wafer back-side grinding process is mainly performed in improved semiconductor package assembling processes, such as multi chip package (MCP) processes, double die package (DDP) processes, thin profile small out-line package (TSOP) processes, and ultra thin profile small out-line package (USOP) processes.

In general, the thickness of a wafer after undergoing a wafer back-side grinding process is reduced to about 100–200 µm. The wafer after grinding is easily damaged by external shock, and sometimes tends to warp. Thus, there is often difficulty when the wafer is transferred to an assembling unit of a semiconductor package process, or when the wafer is handled in the assembling unit. In order to overcome such difficulty, an in-line system in which a wafer grinder and a unit for attaching a dicing tape to a wafer are formed as a single entity have been developed.

FIG. 1 is a block diagram illustrating a conventional in-line system in which a wafer grinder and a dicing tape attaching unit are formed as a single entity. Referring to FIG. 1, a conventional in-line system 10 for performing a semiconductor package assembling process. System 10 includes a wafer loading unit 12 which loads a wafer to which a lamination tape is attached thereinto so as to prevent contamination of the top side of the wafer. System 10 also includes a wafer grinder 14 which grinds the back side of the loaded wafer to reduce the thickness of the wafer, a UV light radiating unit 16 which irradiates UV light onto the top side of the wafer, a dicing tape attaching unit 18 which attaches a dicing tape to the back side of the wafer using a ring frame, a lamination tape detaching unit 20 which detaches the lamination tape from the top side of the wafer, and a wafer unloading unit 22 which unloads the wafer from system 10.

The purpose of irradiating the wafer with UV light is to reduce an adhesive force between the lamination tape and the top side of the wafer. Accordingly, after irradiating the wafer with UV light, the lamination tape can be effectively removed from the top side of the wafer. Here, the dicing tape attaching unit 18 attaches only a general dicing tape to the back side of the wafer.

FIG. 2 is a cross-sectional view of a general dicing tape 30 used in a semiconductor package assembling process. Specifically, the general dicing tape 30 includes a base film 32, formed of polyethylene (PE) and an adhesive layer 34, which is formed of an acrylic polymeric material and is disposed on the base film 32. The adhesive layer 34 has an adhesive property that is reduced by UV light. The general dicing tape 30 further includes a liner film 36 located on the adhesive layer 34. The liner film 36 protects the adhesive layer 34 and is formed of polyethylene terephthalate (PET). Thus, when the general dicing tape 30 is attached to the back side of the wafer using a ring frame, the adhesive layer 34 including the base film 32 is attached to the back side of the wafer and the ring frame, and the liner film 36 is peeled off from the adhesive layer of the general dicing tape 30.

In a subsequent die bonding process, a semiconductor chip having a thickness of less than 100 µm is attached to a chip paddle of a lead frame or substrate, using liquid epoxy. In the case of using liquid epoxy, the semiconductor chip is very thin, and exhibits a die tilt defect. The die tilt defect occurs when a semiconductor chip is not attached in a level state and but is instead in a tilted state. In order to solve this problem, technology for adhering a semiconductor chip to a chip paddle of a lead frame or substrate using an adhesive tape, not a liquid epoxy, has been developed. In this case, a dicing tape including an adhesive tape, i.e., a tape that has been previously cut to a predetermined size, which is referred to as a pre-cut dicing tape. The pre-cut dicing tape is used in a die bonding process. However, the pre-cut dicing tape is applied in a dicing tape attaching process performed as part of the semiconductor package assembling process.

Referring to FIGS. 3 and 4, A refers to a circular pre-cut line and B refers to a pre-cut portion inside the circular pre-cut line A. The circular pre-cut portion B is attached to a wafer and a ring frame (not shown). A portion outside of A is wound together with a liner film 48. FIG. 4 shows a cross-sectional view of the pre-cut dicing tape 40. In particular, a base film 42a and 42b is formed of polyethylene (PE) and is located on the lowermost portion of the pre-cut dicing tape 40. An inner portion of the base film 42, i.e., the pre-cut portion B, marked 42a, and an outer portion of the base film 42, marked 42b, are separated by the pre-cut line A. Also, an expanding film 44a, 44b and an adhesive film 46 are formed on the respective base film 42a, 42b.

The expanding film 44a, 44b attaches the ring frame to the base film 42a. The adhesive film 46 serves to attach a semiconductor chip to a die pad of a lead frame or substrate, instead of liquid epoxy used in the die bonding process. Last, the liner film 48 is formed of polyethylene terephthalate (PET) and protects the expanding film 44a, 44b and the adhesive film 46. After the pre-cut portion B is adhered to the ring frame or wafer, the other portion of the pre-cut line A is withdrawn together with the base film 42b and the expanding film 44b outside the pre-cut portion B.

However, the in-line system 10 of FIG. 1 does not attach the pre-cut dicing tape shown in FIGS. 3 and 4 to the wafer. Also, a dicing tape attaching unit that can attach only a pre-cut dicing tape to a wafer does not perform a wafer back side grinding function, and is used only in an independent process of only attaching the dicing tape to the wafer. Thus, in order to use a pre-cut dicing tape, not an in-line system but a dicing tape attaching unit that attaches only a pre-cut dicing tape to a wafer should be purchased. This causes the following disadvantages.

First, more assembling units are required, so manufacturing costs increase. Second, more assembling units are required, so the space occupied by a semiconductor package assembling line increases. Third, when a wafer made thin by performing a wafer back side grinding process is transferred by an assembling unit, warping of the wafer occurs and there is danger of fracturing the thin wafer.

SUMMARY OF THE INVENTION

The present invention provides an in-line system for performing a semiconductor package assembling process, in which both a general dicing tape and a pre-cut dicing tape are used in one unit.

The present invention also provides a dicing tape attaching unit used in a semiconductor package assembling process, in which both a general dicing tape and a pre-cut dicing tape are used.

According to an aspect of the present invention, there is provided an in-line system used in a semiconductor package assembling process. The system includes a wafer loading unit for loading into the system a wafer whose back side has not been subjected to grinding, a wafer grinder for grinding the back side of a wafer transferred by the wafer loading unit, a dicing tape attaching unit which attaches a dicing tape comprising one of a pre-cut dicing tape and a general dicing tape to the back side of the wafer after grinding by the wafer grinder.

The system may include an unloading unit which transfers the ring frame, in which the dicing tape is attached to the wafer, to the outside.

According to a preferred embodiment of the present invention, a lamination tape is attached to a top side of the wafer loaded into the wafer loading unit, so as to prevent contamination in the wafer grinder, and the wafer grinder includes a UV light radiating portion which radiates UV light onto a top side of the wafer, so as to effectively remove the lamination tape after wafer back side grinding is completed, and the wafer grinding by the wafer grinder has a thickness of 20–200 μm.

Also, according to a preferred embodiment of the present invention, the dicing tape attaching unit includes a tape loader which supplies one of the pre-cut dicing tape and the general dicing tape, a liner film winding reel which winds a liner film separated from the pre-cut dicing tape or general dicing tape, a ring frame stacking portion which stacks a ring frame used to attach the pre-cut dicing tape or general dicing tape to the wafer, an attaching table where the pre-cut dicing tape or general dicing tape is attached on the ring frame and the wafer, a press roller portion which presses the pre-cut dicing tape or general dicing tape supplied by the tape loader and the ring frame, a peeling unit which removes an amount of the general dicing tape remaining after the general dicing tape is attached, from the attaching table, a mount frame transferring portion which transfers the ring frame, in which the pre-cut dicing tape or general dicing tape is attached to the wafer, to a lamination tape detaching portion, and a tape cutter portion which cuts a portion of the general dicing tape remaining after the general dicing tape is attached to the back side of the wafer and the ring frame.

It is preferable that the tape loader rotate in one direction when supplying the pre-cut dicing tape and in the opposite direction when supplying the general dicing tape, and the tape loader rotates clockwise when supplying the pre-cut dicing tape, and the tape loader rotates counterclockwise when supplying the general dicing tape.

Preferably, in the case of the pre-cut dicing tape, the liner film winding reel winds the portion of the pre-cut dicing tape remaining after a pre-cut process is performed, including a liner film.

Also, preferably, the system further includes a lamination tape detaching unit which detaches the lamination tape from the wafer grinder.

According to another aspect of the present invention, there is provided a dicing tape attaching unit. The dicing tape attaching unit includes a tape loader which supplies one of a pre-cut dicing tape and a general dicing tape depending on the direction in which the taper loader rotates, a liner film winding reel which winds a liner film separated from the pre-cut dicing tape or general dicing tape, a ring frame stacking portion which stacks a ring frame used to attach the pre-cut dicing tape or general dicing tape to a wafer, a wafer stacking portion which stacks a wafer used to attach the pre-cut dicing tape or general dicing tape to a wafer, an attaching table where the pre-cut dicing tape or general dicing tape is attached to the ring frame and the wafer, a press roller portion which presses the pre-cut dicing tape or general dicing tape supplied by the tape loader and the ring frame, a peeling unit which removes an amount of the general dicing tape remaining after the general dicing tape is attached, from the attaching table, a mount frame transferring portion which transfers the ring frame, in which the pre-cut dicing tape or general dicing tape is attached to the wafer, to a lamination tape detaching portion, a tape cutter portion which cuts a portion of the general dicing tape remaining after the general dicing tape is attached to the back sides of the wafer and the ring frame, and an unloading unit which transfers the ring frame, in which the pre-cut dicing tape or general dicing tape is attached to the wafer, to the outside.

According to a preferred embodiment of the present invention, the tape loader rotates clockwise when supplying the pre-cut dicing tape, and the tape loader rotates counterclockwise when supplying the general dicing tape.

Also, preferably, in the case of the pre-cut dicing tape, the liner film winding reel winds the amount of the pre-cut dicing tape remaining after a pre-cut process is performed, including a liner film.

With the present invention, without needing to purchase an additional dicing tape attaching unit for attaching a pre-cut dicing tape to a wafer, a pre-cut dicing tape and a general dicing tape can be attached to an in-line system in which a wafer grinder and a dicing tape attaching unit are formed as a single body. Thus, manufacturing costs and space required for assembling equipment can be reduced, and damage or warpage occurring when a ground down wafer is transferred or handled can be prevented.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete and will fully convey the scope of the invention to those skilled in the art.

First, before explaining an embodiment of the present invention, various tapes used in the present invention and their functions will be described. Tapes used before a wire bonding process in a semiconductor package assembling process include a lamination tape used in a wafer back side grinding process and a dicing tape used in a wafer sawing process.

The lamination tape is used to reduce contamination of the top side of a wafer during a wafer back side grinding process. Thus, the lamination tape protects the top side of the wafer from being contaminated during the wafer back side grinding process, absorb mechanical shock and minimize pressure applied to the wafer. The lamination tape is stripped off from the wafer and is removed after the wafer back side grinding process is completed and before a sawing process is performed. The lamination tape may be removed by reducing its adhesive force by irradiating it with UV light. Alternatively, the lamination tape may be removed without using UV light. However, in most cases, a lamination tape whose adhesive force can be reduced by UV light is used.

Figure 1:
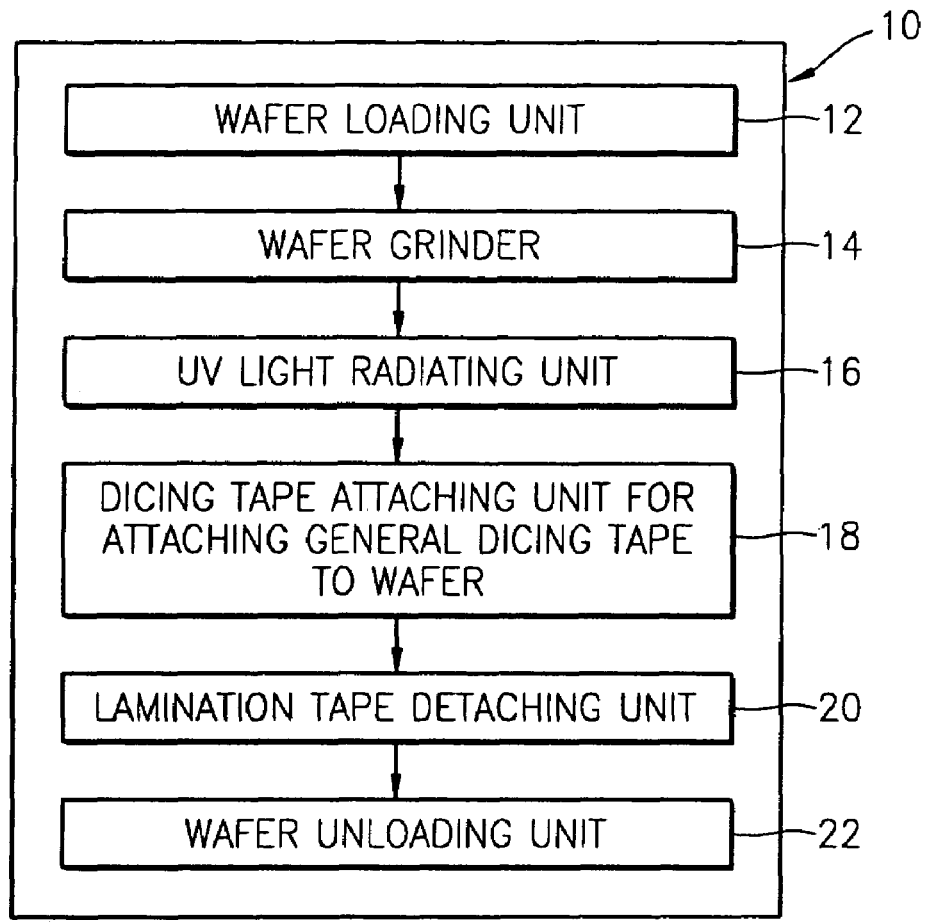
FIG. 1 is a block diagram illustrating a conventional in-line system in which a wafer grinder and a dicing tape attaching unit are formed as a single body.
Figure 2:
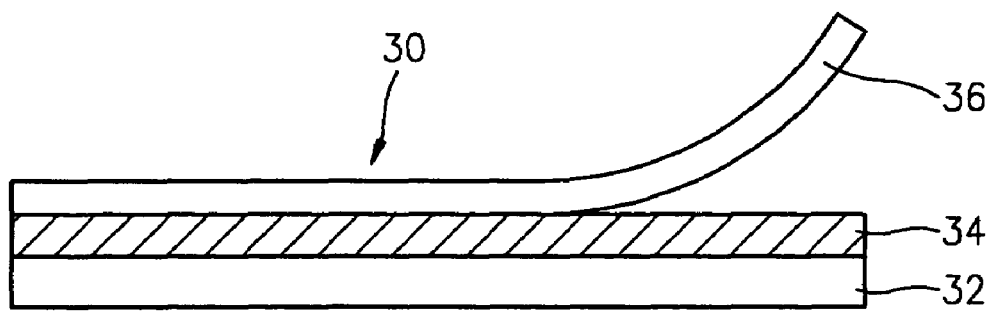
FIG. 2 is a cross-sectional view of a general dicing tape used in a semiconductor package assembling process.
Figure 3:
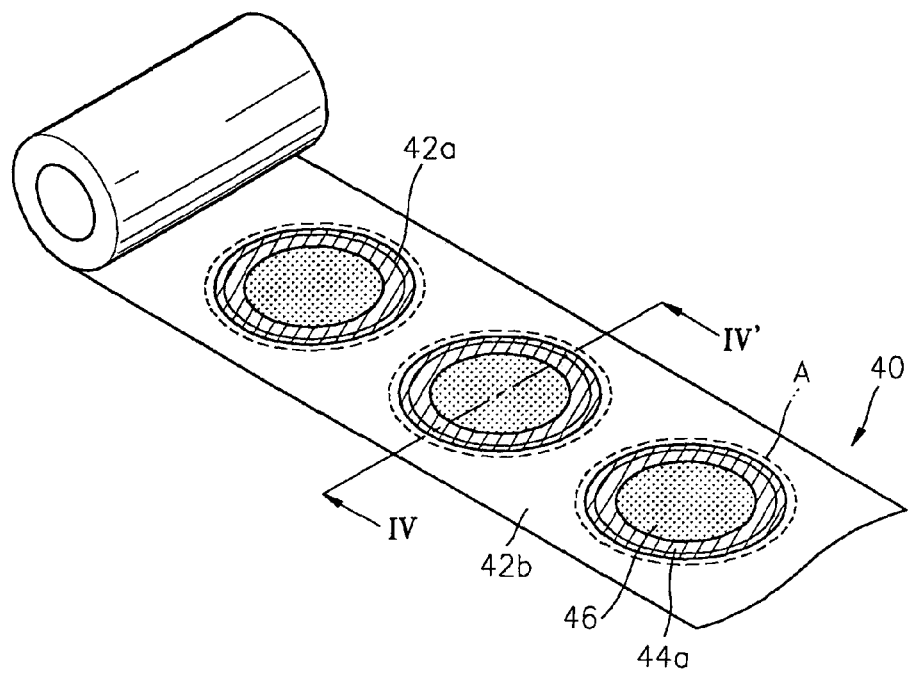
FIG. 3 is a perspective view of a pre-cut dicing tape.
Figure 4:
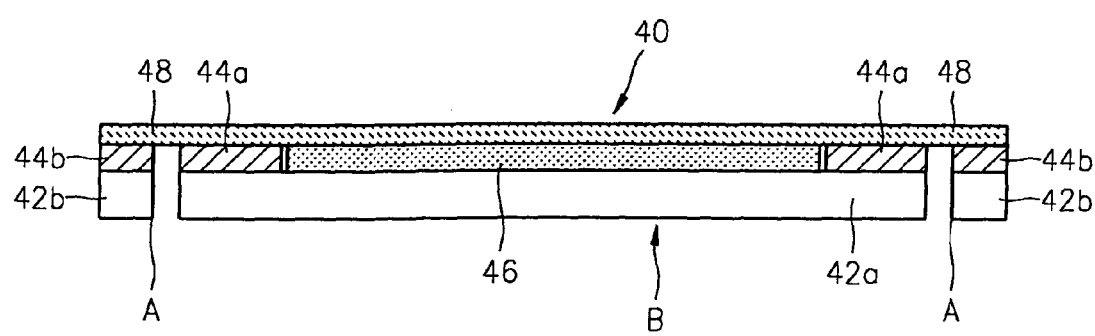
FIG. 4 is a cross-sectional view taken along line IV–IV' of FIG. 3.

The dicing tape includes, for example, above-described a general dicing tape (FIG. 2) and a pre-cut dicing tape (FIGS. 3 and 4). The general dicing tape does not have an adhesive tape layer used instead of epoxy in a die bonding process and is not pre-cut. The pre-cut dicing tape has an adhesive tape layer used in a die bonding process and is pre-cut for easy detachment of a pre-cut portion and re-attachment of the pre-cut portion to a ring frame and a wafer.

EMBODIMENT

Figure 5:
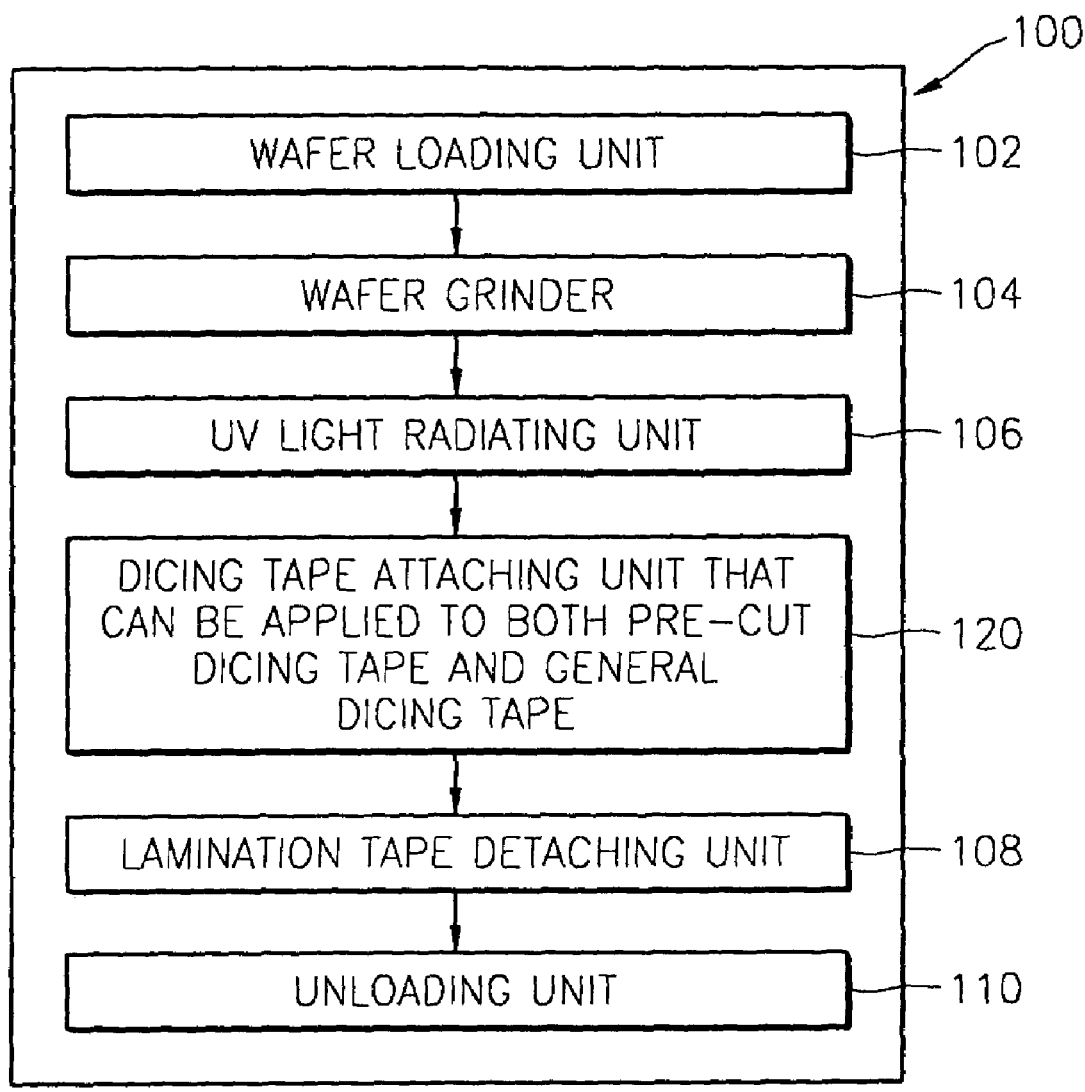
FIG. 5 is a block diagram schematically illustrating an in-line system according to the present invention, in which a wafer grinder and a dicing tape attaching unit are formed as a single entity.

FIG. 5 is a block diagram schematically illustrating an in-line system according an embodiment of the present invention, in which a wafer back side grinding unit and a dicing tape attaching unit are formed as a single entity. Referring to FIG. 5, an in-line system 100 is provided, in which a wafer back side grinding unit and a dicing tape attaching unit are formed as a single entity. The system 100 includes the following components: (a) a wafer loading unit 102 which loads a wafer whose back side is not ground down, (b) a wafer grinder 104 which grinds the back side of a wafer loaded by the wafer loading unit 102, (c) a UV light radiating unit 106 which irradiates UV light onto the top side of the wafer so as to effectively remove the lamination tape, (d) a dicing tape attaching unit 120 which attaches a dicing tape to the back side of the wafer ground down by the wafer grinder 104 using a ring frame, (e) a lamination tape detaching unit 108 which detaches the lamination tape whose adhesive force is reduced by the UV light radiating unit 106, from the wafer grinder 104, and (f) an unloading unit 110 which transfers the ring frame, in which the dicing tape is attached to the wafer, to the outside of the in-line system 100.

Preferably, the wafer ground down by the wafer grinder 104 has a thickness of about 20–200 μm. In the in-line system used in a semiconductor package assembling process according to an embodiment of the present invention, the dicing tape attaching unit 120 is an important feature. In the prior art, only the general dicing tape is applied But in the present invention, a pre-cut dicing tape can be applied together with the general dicing tape.

Accordingly, no additional dicing tape attaching unit for attaching only a pre-cut dicing tape is separately needed. A wafer back side grinding process and a dicing tape attaching process can be performed simultaneously with the inventive in-line system such that problems occurring when a wafer is transferred or handled are prevented.

Figure 6:
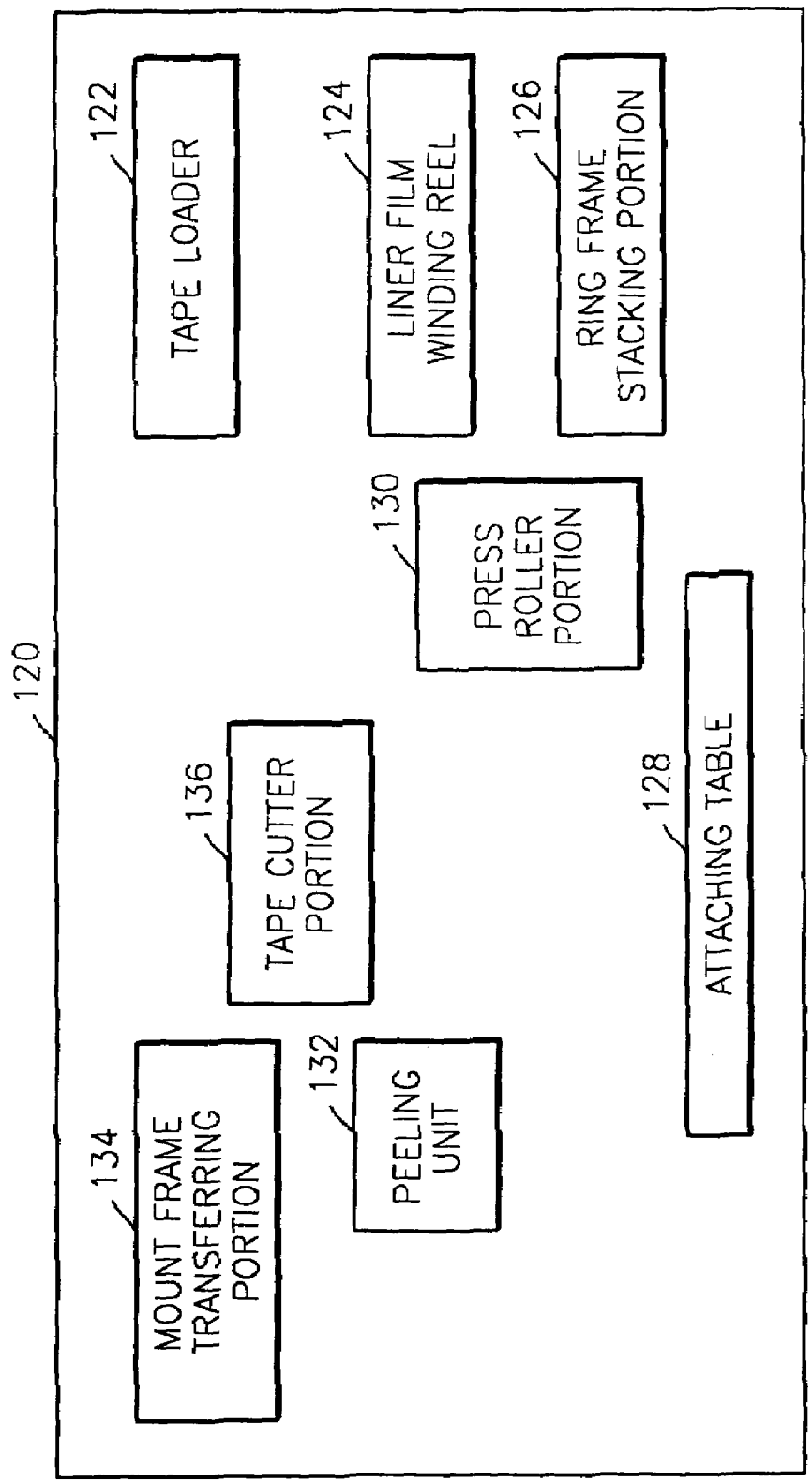
FIG. 6 is a block diagram schematically illustrating the dicing tape attaching unit of FIG. 5.

Referring to FIG. 6, the dicing tape attaching unit 120 according to the present invention includes the following components: (a) a tape loader 122 which supplies a pre-cut dicing tape or general dicing tape, (b) a liner film winding reel 124 which winds a liner film separated from the pre-cut dicing tape or general dicing tape, (c) a ring frame stacking portion 126 which stacks a ring frame used to attach the pre-cut dicing tape or general dicing tape onto a wafer and supplies the ring frame to an attaching table, (d) an attaching table 128 where the pre-cut dicing tape or general dicing tape is attached to the ring frame and the wafer, (e) a press roller portion 130 which presses the pre-cut dicing tape or general dicing tape supplied by the tape loader 122 and the ring frame, (f) a peeling unit 132 which removes the portion of the general dicing tape, remaining after attaching, from the attaching table 128, (g) a mount frame transferring portion 134 which transfers the ring frame, in which the pre-cut dicing tape or general dicing tape is attached to the wafer, to a lamination tape detaching portion (108 of FIG. 5), and (h) a tape cutter portion 136 which cuts a portion remaining after the general dicing tape is attached to the back sides of the wafer and the ring frame.

According to the present invention, the general dicing tape or pre-cut dicing tape is attached to the tape loader 122, and the tape loader 122 can supply both the general dicing tape and the pre-cut dicing tape while varying the direction of rotation.

Figure 7:
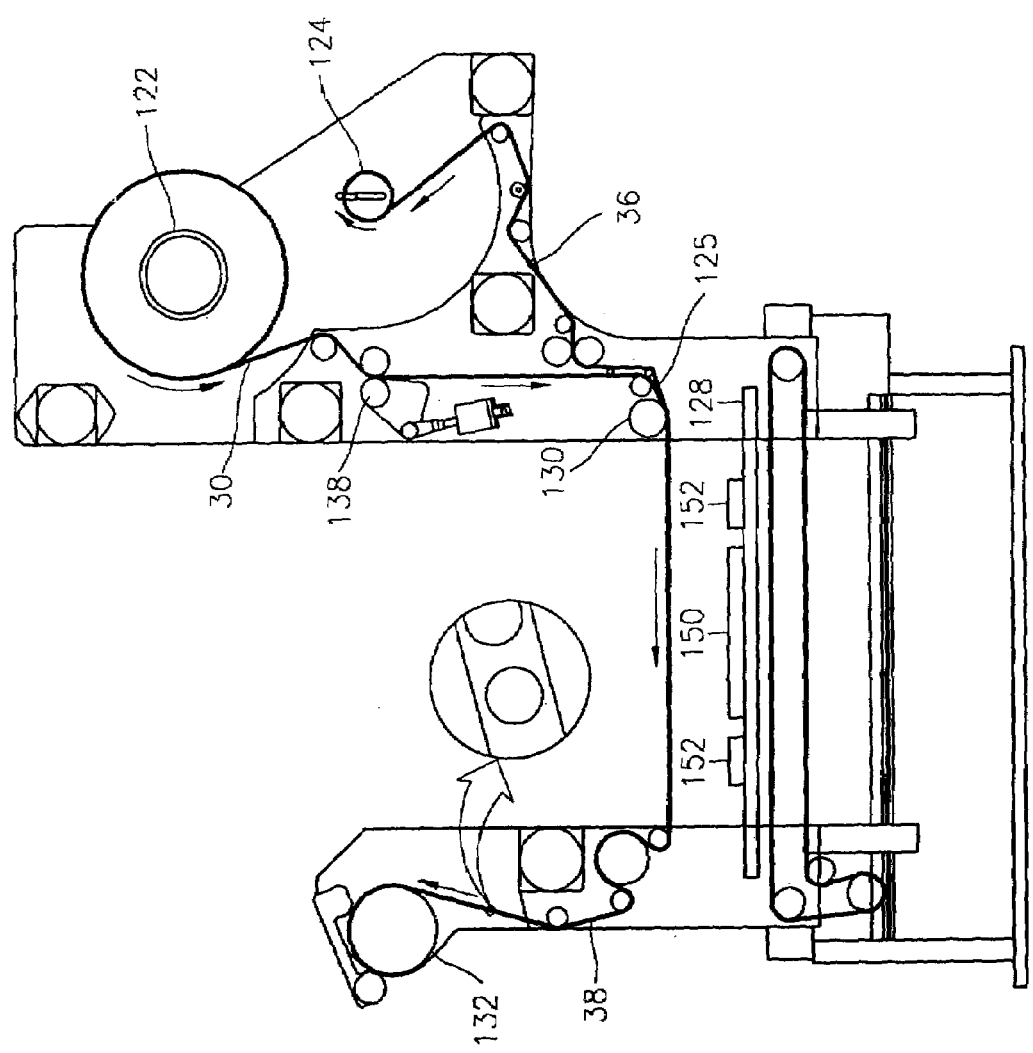
FIG. 7 is a side view illustrating a step of attaching the general dicing tape on a wafer, which is performed by the dicing tape attaching unit of FIG. 5.
Figure 8:
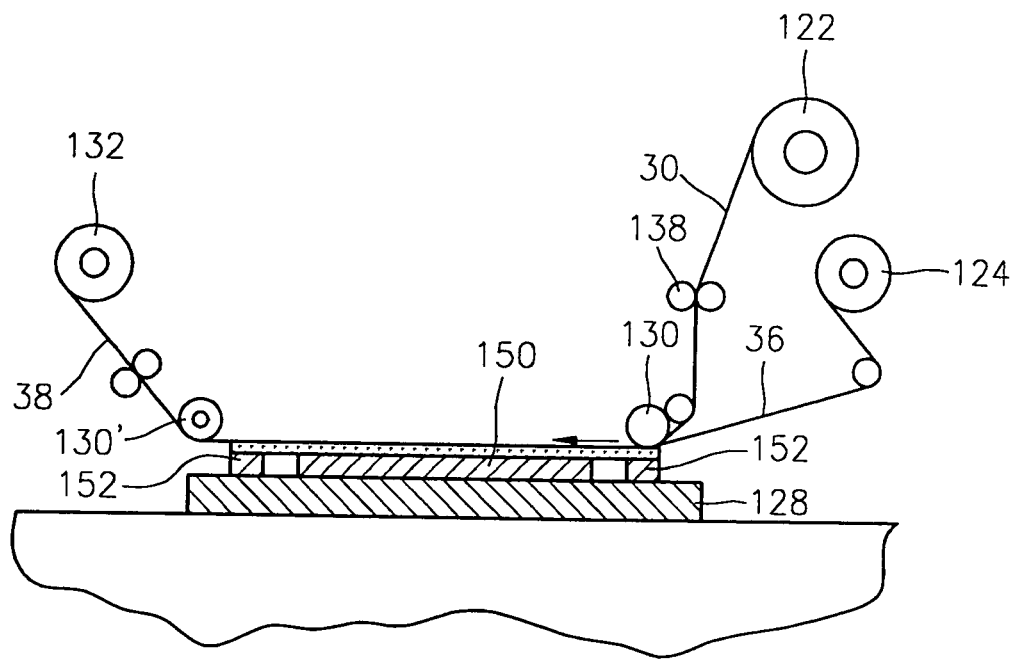
FIGS. 8 and 9 are side views illustrating the operation of an attaching table of the dicing tape attaching unit.
Figure 9:
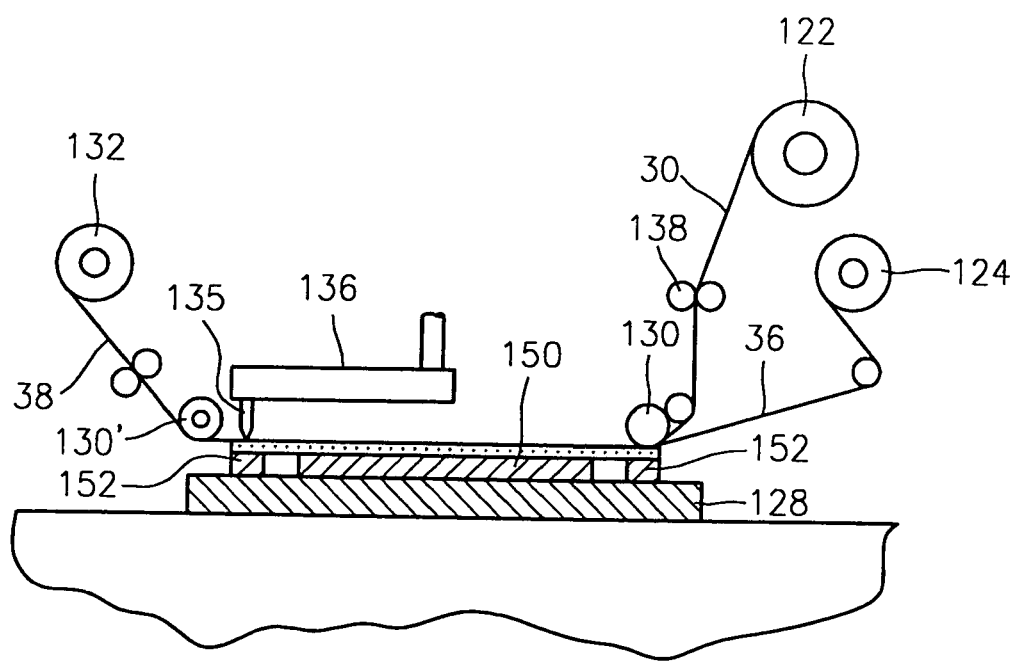

Referring to FIGS. 7 through 9, a ring frame 152 and a wafer 150 are loaded onto the attaching table 128. Here, the top side of the wafer 150 faces downward. A general dicing tape 30, wound on the tape loader 122, is supplied through a pinch roller 138 while the tape loader 122 rotates counterclockwise. Only a liner film 36, which serves as a protection layer, is separated from the general dicing tape 30 by a peeling bar 125, and is wound on the liner film winding reel 124. A base film and an adhesive film of the general dicing tape 30 are supplied onto the attaching table 128.

When the general dicing tape 30 (from which the liner film 36 is removed) is supplied onto the attaching table 128, the press roller portion 130 which presses the general dicing tape 30 is moved from right to left, and then attaches the general dicing tape 30 to the ring frame 152 and the back side of the wafer 150. After the general dicing tape 30 is attached to the ring frame 152 and the back side of the wafer 150, the tape cutter portion 136 of the dicing tape attaching unit is moved and placed on the attaching table 128 such that a cutter 135 inside the tape cutter portion 136 rotates along an inner arcuate surface of the ring frame 152, and then cuts the general dicing tape 30. The remaining portion 38 of the cut general dicing tape 30 is wound on a winding reel of the peeling unit 132 and is scrapped.

Figure 10:
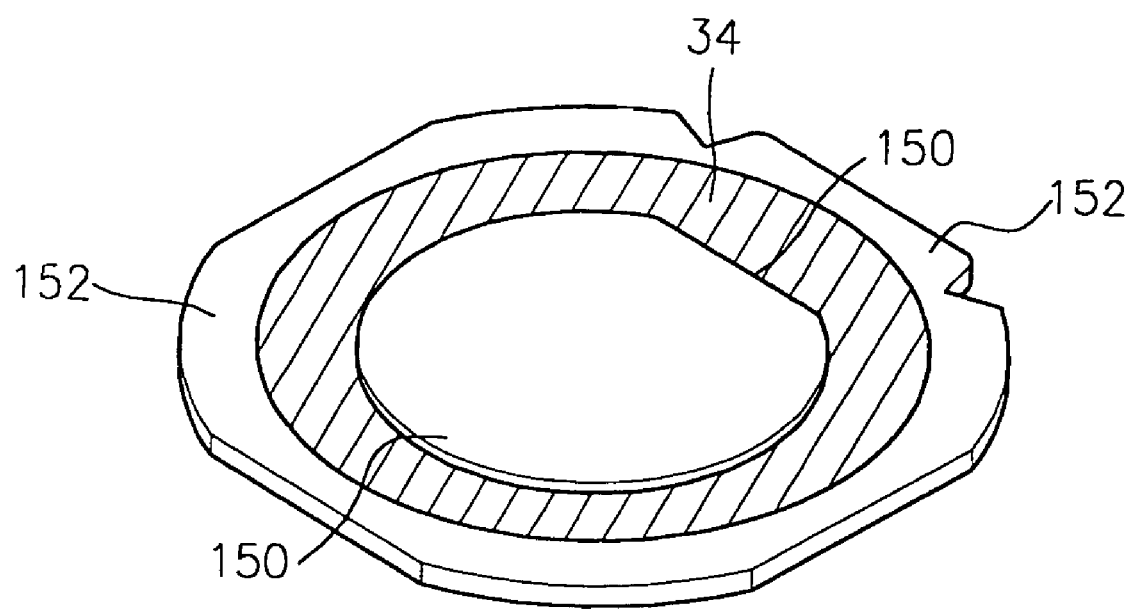
FIG. 10 is a perspective view of a ring frame in which the general dicing tape is attaching to the wafer, in the dicing tape attaching unit of FIG. 5.

Referring to FIG. 10, an adhesive film 34 of the general dicing tape 30 is attached to the ring frame 152 and the back side of the wafer 150. The ring frame 152, to which the general dicing tape 30 is attached to the back side of the wafer 150, serves as a carrier for transferring the wafer 150 from a sawing process to a die bonding process.

Figure 11:
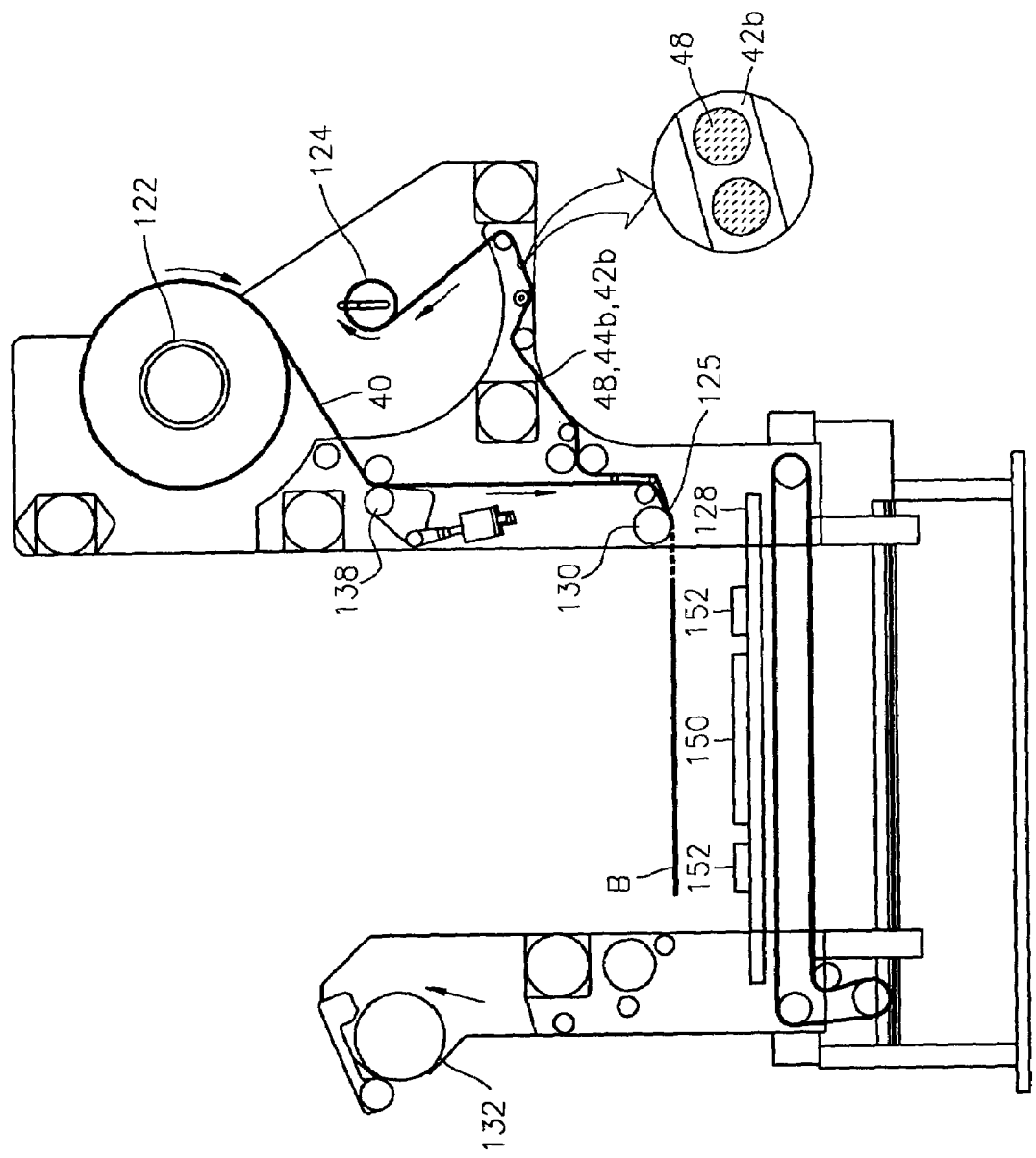
FIG. 11 is a side view illustrating a step of attaching a pre-cut dicing tape to the wafer, in the dicing tape attaching unit of FIG. 5.

Referring to FIG. 11, the ring frame 152 and the wafer 150 are loaded onto the attaching table 128. Similarly, the top side of the wafer 150 faces downward. Next, a pre-cut dicing tape 40 (such as depicted in FIGS. 3 and 4) is attached to the tape loader 122, instead of the general dicing tape 30. Here, the tape loader 122 supplies the pre-cut dicing tape 40 clockwise, which is opposite to the direction in which the tape loader 122 supplies the general dicing tape 30. The pre-cut dicing tape 40 supplied by the tape loader 122 passes through a plurality of pinch rollers 138. Only a pre-cut portion (B of FIG. 4) is separated from the peeling bar 125. The remaining portion of the pre-cut dicing tape 40 is wound on the liner film winding reel 124. Thus, only the pre-cut portion (B of FIG. 4) is attached by the press roller portion 130 onto the ring frame 152 and onto the back side of the wafer 150. When the pre-cut dicing tape 40 is attached to the wafer, the peeling unit 132 or tape cutter portion 136, used when the general dicing tape 30 is attached to the wafer, does not operate.

By adjusting the distance that the press roller portion 130 is pressed and moved, the pre-cut portion B can be attached to the ring frame 152 and the back side of the wafer 150 regardless of the size of the wafer 150. Thus, in the in-line system used in a semiconductor package assembling process according to an embodiment of the present invention, the pre-cut dicing tape 40 can be attached to the wafer 150 regardless of the size of the wafer 150. Also, an expanding film 44*b* and a base film 42*b*, excluding the pre-cut portion (B of FIG. 4), are wound together with the liner film 48 on the liner film winding reel 124.

Thus, according to the present invention, a conventional general dicing tape attaching unit is modified or converted so that the pre-cut dicing tape also can be attached to the ring frame and the wafer, thereby solving several problems of the prior art.

Figure 12:
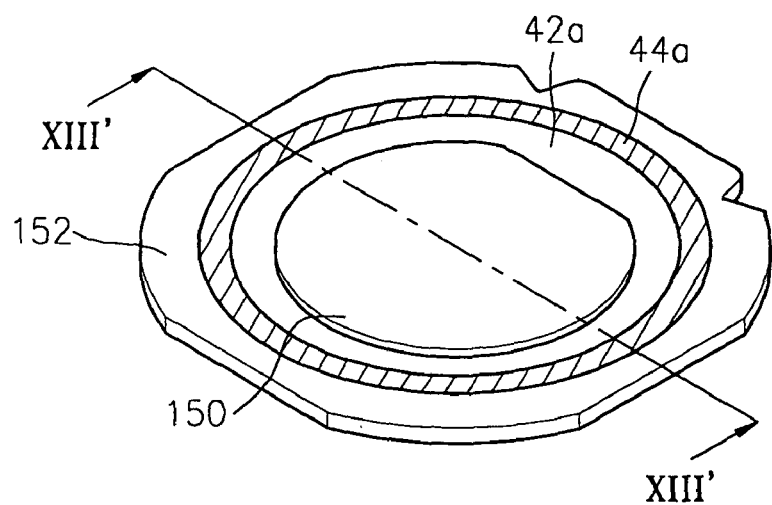
FIG. 12 is a perspective view of a ring frame in which the pre-cut dicing tape is attached to the wafer, in the dicing tape attaching unit of FIG. 5.
Figure 13:
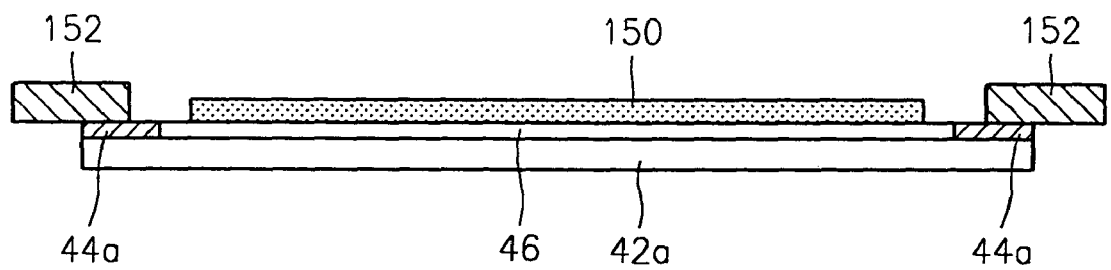
FIG. 13 is a cross-sectional view taken along line XII-I–XIII' of FIG. 12.

Referring to FIGS. 12 and 13, it is to be noted that the wafer 150 is attached to the pre-cut dicing tape 40 in a different manner than the method in which the wafer 150 is attached to the general dicing tape 30. Adhesion to film 46 of the ring frame 152 and a base film 42*a* is accomplished by the expanding film 44*a*. Adhesion to the back side of the wafer 150 and the base film 42*a* is accomplished by the adhesive film 46. The adhesive film 46, which is employed herein instead of liquid epoxy used in the prior art, adhere a chip paddle or die pad of a lead frame or substrate to a semiconductor chip in a die bonding process. The adhesive film 46 may be formed of epoxy or polyimide constituents, or of a synthetic material including epoxy or polyimide.

Modified Embodiment

The modified embodiment is directed to an in-line system used in a semiconductor package assembling process. However, the concept of the present invention may also be applied to an isolated dicing tape attaching unit that is not part of an in-line system. That is, there are only two kinds of dicing tape attaching units in the prior art. These dicing tape attaching units include a dicing tape attaching unit for a general dicing tape and a dicing tape attaching unit for a pre-cut dicing tape. However, by applying the concept of the present invention, one dicing tape attaching unit can handle both a general dicing tape and a pre-cut dicing tape. In the present modified embodiment, this will be described.

Figure 14:
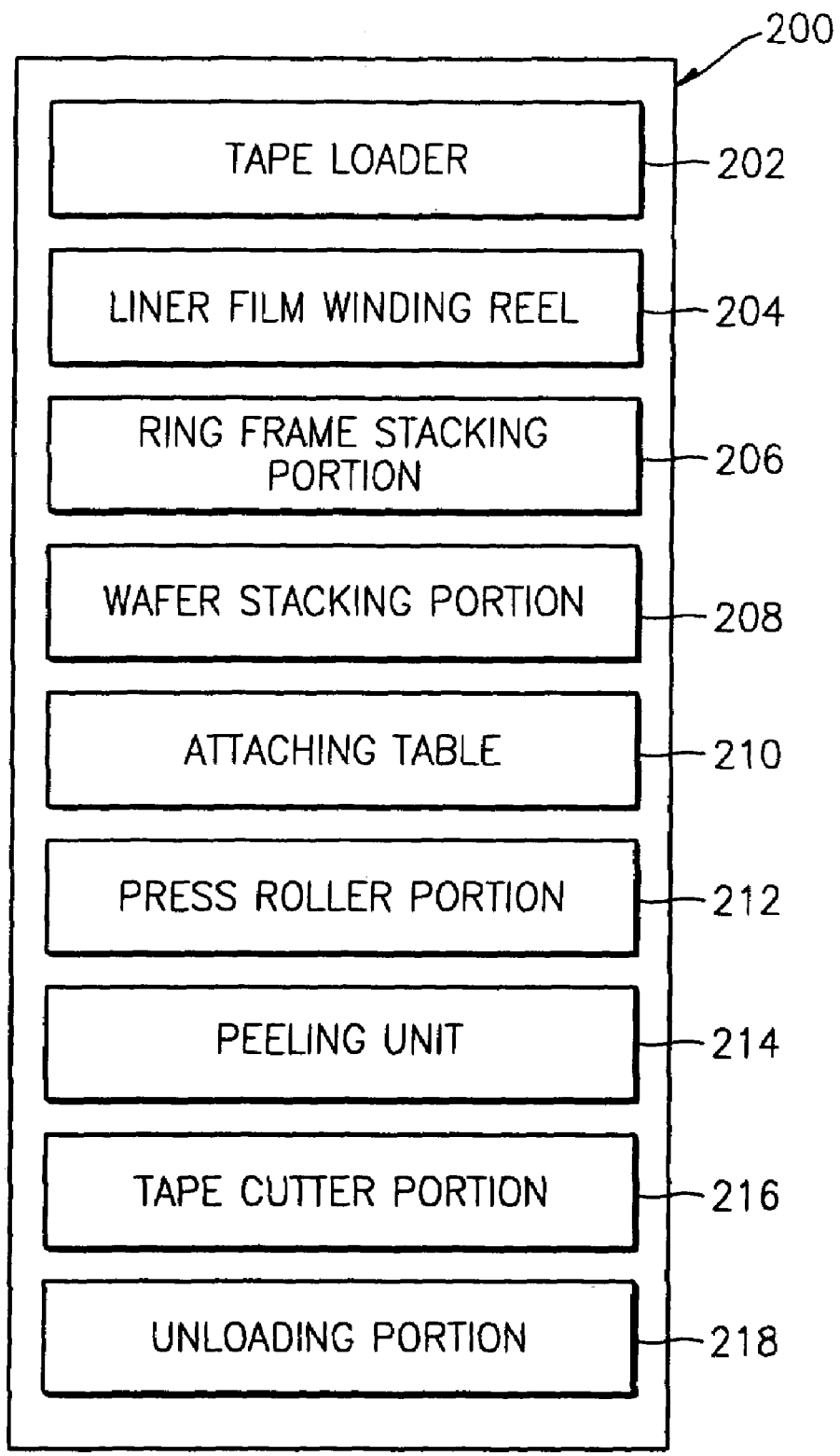
FIG. 14 is a block diagram schematically illustrating a dicing tape attaching unit according to a modified embodiment of the present invention.

Referring to FIG. 14, a dicing tape attaching unit 200, according to the modified embodiment of the present invention, includes (a) a tape loader 202 which supplies a pre-cut dicing tape or a general dicing tape, depending on the direction of rotation, (b) a liner film winding reel 204 which winds a liner film separated from the pre-cut dicing tape or general dicing tape, (c) a ring frame stacking portion 206 which stacks a ring frame used to attach the pre-cut dicing tape or the general dicing tape to a wafer, and supplies the ring frame to an attaching table, (d) a wafer stacking portion 208 which stacks a wafer to which the pre-cut dicing tape or the general dicing tape are attached, and supplies the wafer to the attaching table, (e) an attaching table 210 where the pre-cut dicing tape or general dicing tape is attached to the ring frame and the wafer, (f) a press roller portion 212 which presses the pre-cut dicing tape or general dicing tape supplied by the tape loader 202 and the ring frame, (g) a peeling unit 214 which removes the portion the general dicing tape remaining after attaching, from the attaching table 210, (h) a tape cutter portion 216 which cuts a portion remaining after the general dicing tape is attached to the back sides of the wafer and the ring frame, and (g) an unloading unit 218 which transfers the ring frame, in which the pre-cut dicing tape or general dicing tape is attached to the wafer, to an outside work site.

The dicing tape attaching unit 200 is an individual process unit, and thus further includes the wafer stacking unit 208. The modified embodiment of the present invention is similar to the above-described in-line system embodiment except that it does not include some elements such as a lamination tape detaching portion and a mount frame transferring portion, which are required in the structure of the in-line system. In any case, the operational principle of attaching a general dicing tape to a wafer, or the operational principle of attaching a pre-cut dicing tape, is similar in both embodiments, and thus the functional descriptions thereof will not be repeated.

Accordingly, the present invention has the following advantages.

First, when a semiconductor package is assembled, a general dicing tape and a pre-cut dicing tape can be applied by one and the same unit. Second, because the present invention can be embodied as an in-line system, warpage of or damage to a wafer occurring when a wafer is transferred or handled, is prevented such that the yield of semiconductor packages is increased and the reliability of the semiconductor packages is improved. Third, an additional unit for attaching a pre-cut dicing tape is not needed, which reduces the cost of assembling semiconductor packages and the space occupied by a semiconductor package assembling line. Fourth, even though a pre-cut dicing tape is used, problems occurring when a ground-down wafer is transferred or handled can be solved.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An in-line system used in a semiconductor package assembling process, the system comprising:
    a wafer loading unit for loading into the system a wafer having a back side which has not been subjected to grinding;
    a wafer grinder for grinding the back side of a wafer loaded by the wafer loading unit; and
    a dicing tape attaching unit constructed and configured to attach a pre-cut dicing tape and a general dicing tape to the back side of the wafer after grinding by the wafer grinder, wherein the dicing tape attaching unit includes a tape loader to supply one of the pre-cut dicing tape and the general dicing tape to the system, and wherein the tape loader rotates in one direction when supplying the pre-cut dicing tape and in the opposite direction when supplying the general dicing tape.

2. The system of claim 1, wherein a lamination tape is attached to a top side of the wafer, the wafer and attached lamination tape being loaded into the wafer loading unit so as to prevent contamination in the wafer grinder.

3. The system of claim 1, wherein the wafer grinder includes a UV light radiating portion which irradiates UV light onto a top side of the wafer, so as to effectively remove the lamination tape after the grinding is completed.

4. The system of claim 1, wherein the wafer after grinding by the wafer grinder has a thickness of 20–200 µm.

5. The system of claim 1, which further includes a ring frame to which said wafer is attached, and an unloading unit which transfers the ring frame and wafer to a location outside the system.

6. The system of claim 1, wherein the tape loader rotates clockwise when supplying the pre-cut dicing tape.

7. The system of claim 1, wherein the tape loader rotates counterclockwise when supplying the general dicing tape.

8. The system of claim 1, which further includes a liner film winding reel which winds the portion of the pre-cut dicing tape remaining after a pre-cut process is performed together with a liner film.

* * * * *